United States Patent [19]

Sato

[11] Patent Number: 4,765,526
[45] Date of Patent: Aug. 23, 1988

[54] WIRE BONDING APPARATUS

[75] Inventor: Kazuhide Sato, Yokohama, Japan

[73] Assignee: Kabushiki Kaisha Toshiba, Kawasaki, Japan

[21] Appl. No.: 7,179

[22] Filed: Jan. 27, 1987

[30] Foreign Application Priority Data

Jan. 29, 1986 [JP] Japan .................................. 61-17366

[51] Int. Cl.$^4$ .............................................. B23K 37/00
[52] U.S. Cl. ........................................ 228/4.5; 228/179
[58] Field of Search ..................... 228/4.5, 179, 44.7; 29/850

[56] References Cited

U.S. PATENT DOCUMENTS 3,627,190 12/1971 Ramsey ............................... 228/44.7

Primary Examiner—Nicholas P. Godici
Assistant Examiner—Karen Skillman
Attorney, Agent, or Firm—Foley & Lardner, Schwartz, Jeffery, Schwaab, Mack, Blumenthal & Evans

[57] ABSTRACT

An apparatus is provided with a capillary having a plurality of through holes. A plurality of bonding wires are delivered through the plurality of through holes at the same time from a wire supply unit. The apparatus connects a plurality of bonding wires to an element subject to bonding at the same time.

4 Claims, 2 Drawing Sheets

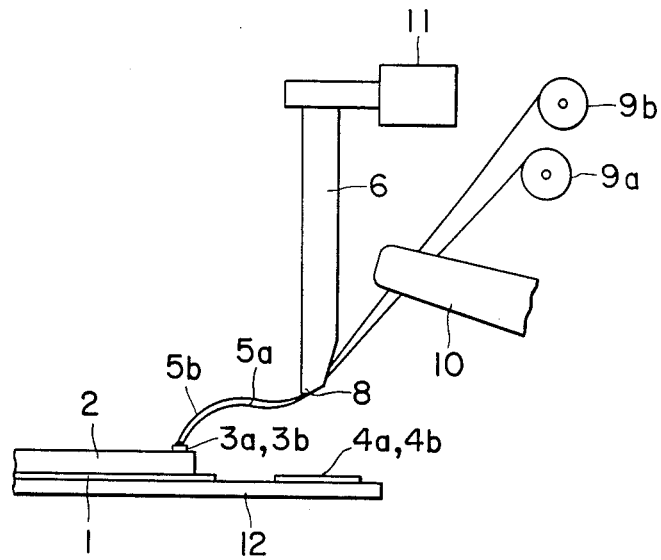
F I G. I
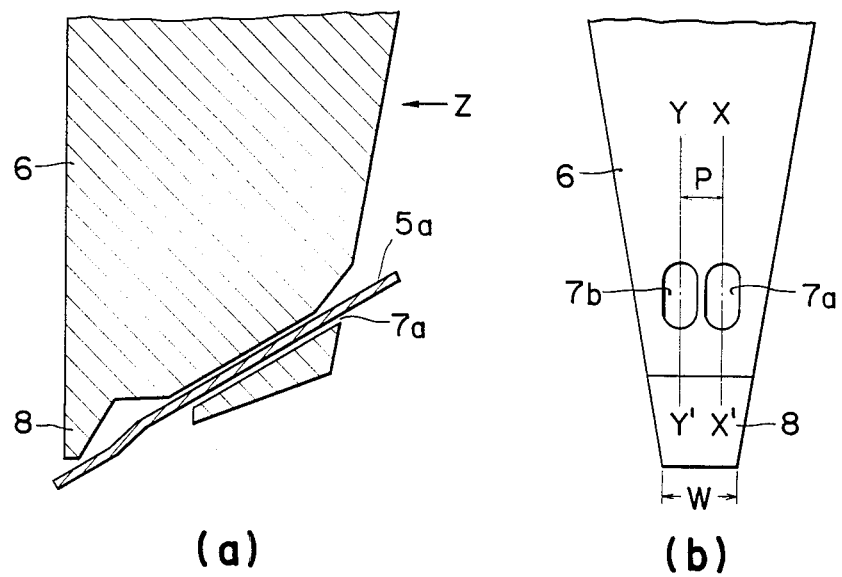
(a)  (b)
F I G. 2

WIRE BONDING APPARATUS

BACKGROUND OF THE INVENTION

The present invention relates to a wire bonding apparatus, and more particularly to a wire bonding apparatus which can apply high speed bonding to high density semiconductor integrated circuits.

In semiconductor devices, a bonding process is required in order to make an electrical connection between the semiconductor pellet and lead portions. A typical bonding method which has been implemented in the art is the wire bonding method. Ordinarily, a bonding pad on the semiconductor pellet and a bonding portion on the inner lead are interconnected by a bonding wire. The bonding wire is delivered to each wiring position by means of a capillary.

In recent years, other bonding methods, e.g., the TAB (Tape Automated Bonding) method and the CCB (Controlled Collapse Bonding) method, have been developed as a substitute for the wire bonding method. In accordance with the TAB method, the semiconductor pellet is mounted on a table and a bump is directly pressure-bonded to the inner lead without using bonding wire. In accordance with the CCB method, a solder ball is used to pass a portion subject to bonding through a furnace once to thereby cause collective bonding. The above-mentioned methods can advantageously perform the bonding for multi-terminal semiconductor devices, and they are gradually becoming accepted.

As stated above, the wireless bonding has been increasingly accepted in recent years, but wire bonding is still mainly practiced. This is because the wireless bonding generally has the economical restriction in that a work device at the side of the semiconductor pellet is required, resulting in necessity of purchasing new equipment, and there is the additional drawback with the TAB method that an uniformity in weighting and an uniformity of temperature are required in the case of implementing pressure-bonding, giving rise to technical difficulty. The drawback with the CCB method is that fatigue occurs during given temperature cycles because a solder is used.

For the reasons stated above, it is anticipated that the demand for the wire bonding apparatus will still increase, but will continue to be hampered by the drawbacks with the conventional wire bonding apparatus which are as follows.

(1) Bonding speed is slow.

As compared of the method to implement bonding of the entire pellet in a collective manner as in the TAB method or the CCB method, since wires are connected to the pellet one by one in the conventional wire bonding apparatus, the bonding time becomes lengthy as the number of terminals of the semiconductor device increase, thus constituting a serious hindrance for mass production.

(2) There is a limitation in the implementation at high density.

For realizing the high integration of the semiconductor device, the bonding pad pitch and the inner lead pitch must be reduced. However, a problem as described just below as pitches are thus reduced, and a pitch reduction becomes extremely difficult.

(3) Life time of capillary is short.

As stated above, the supply of bonding wires is conducted by using a capillary. Specifically, in the case of wedge bonding, the pressure-bonding portion of the capillary is always subject to strong impact. For this reason, damage will occur when used for a long time. In addition, since the width of the pressure-bonding portion must be reduced for realizing high density implementation as described above, the strength of this portion is further lowered, which tends to make the life time increasingly short.

SUMMARY OF THE INVENTION

An object of the present invention is to provide a wire bonding apparatus which has a high bonding speed, can realize high density implementation, and has a long life time.

In accordance with the present invention, in the wire bonding apparatus, a plurality of through holes for passing bonding wires therethrough are provided in a capillary, and a plurality of bonding wires are delivered to the capillary at the same time. Then, the plurality of bonding wires thus delivered are respectively connected to a plurality of elements or portions subject to bonding, thus achieving the above object.

With the apparatus according to the present invention, after the capillary is moved to a predetermined position, a plurality of bonding wires are simultaneously subjected to bonding at the predetermined position, thus making it possible to effectively reduce the bonding time. In addition, since a plurality of bonding wires are caused to pass through the single capillary the pitch can be reduced even when the diameter of the capillary is large, thus realizing high density implementation and long life time of the capillary.

BRIEF DESCRIPTION OF THE DRAWINGS

FIG. 1 is an side plan view illustrating an embodiment of a wire bonding apparatus according to the present invention;

FIG. 2(a) is a side cross sectional view showing the end portion of a capillary provided in the apparatus shown in FIG. 1;

FIG. 2(b) is a schematic view showing the back of the end portion of the capillary shown in FIG. 2(a);

DETAILED DESCRIPTION OF THE PREFERRED EMBODIMENT

Figure 3:
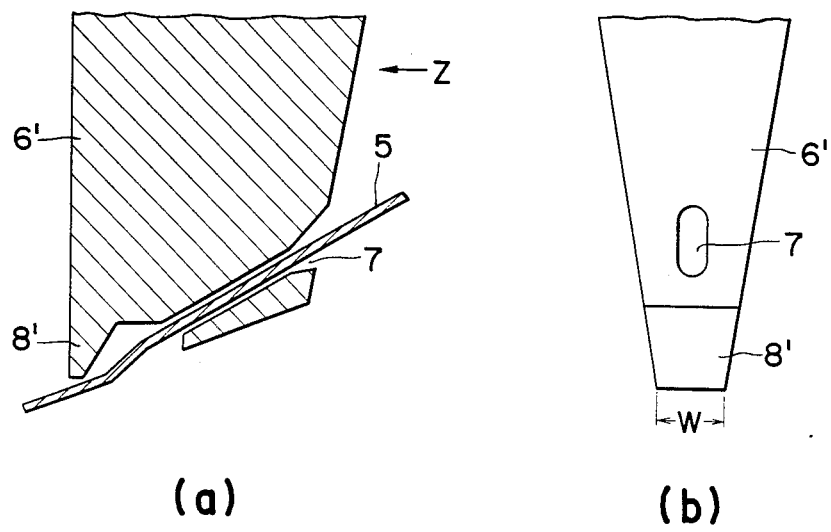
FIG. 3(a) is a side cross sectional view showing the end portion of a capillary provided in a conventional apparatus.
FIG. 3(b) is a schematic view showing the back of the end portion of the capillary shown in FIG. 3(a).

The present invention will be described in detail in connection with a preferred embodiment with reference to the attached drawings.

FIG. 1 shows an arrangement of a wire bonding apparatus according to a preferred embodiment of the present invention. On a semiconductor pellet 2 mounted on a frame bed 1, a plurality of bonding pads 3a and 3b are formed. Bonding pads 3a and 3b and inner leads 4a and 4b corresponding thereto will be connected by two bonding wires 5a and 5b. This apparatus is one example of the wire bonding apparatus for implementing the wedge bonding. FIG. 2(a) is an enlarged cross sectional view showing the end portion of a capillary 6 used in the apparatus according to this embodiment, and FIG. 2(b) is a view when the end portion of the capillary 6 is viewed from the Z direction in FIG. 2(a). The cross sectional portion hatched in FIG. 2(a) corresponds to the cross sectional portion taken along the lines X—X' in FIG. 2(b). This capillary 6 includes two through holes 7a and 7b through which bonding wires 5a and 5b are passed. The distance between centers of both the through holes, i.e., pitch P, is designed to be equal to the bonding pad pitch and the inner lead pitch on the semiconductor pellet. As shown in FIG. 1, the bonding wires 5a and 5b are delivered from spools 9a and 9b respectively through a clamp 10 at the same time. The capillary 6 is caused to be moved in upward and downward directions in FIG. 1 by a driver or drive unit 11. On the other hand, the frame bed 1 and the inner lead 4 are mounted on an XY table 12. Thus, they move in a plane perpendicular to the moving direction of the capillary 6.

By the movement of the XY table, an element or a portion to be bonded (the bonding pad 3 or the inner lead 4) is positioned immediately below the capillary 6, the capillary 6 lowered to the bonding position, and the bonding wires 5a and 5b are pressure-bonded to the respective elements subject to bonding by the pressure-bonding portion 8 provided at the end portion of the capillary 6. At this time, ultrasonic vibration is exerted on the capillary 6 by the driver 11. The pressure-bonding is thus completed. FIG. 1 shows bonding wires 5a and 5b pressure-bonded to the bonding pads 3a and 3b, before the wires are, in turn, pressure-bonded to the inner leads 4a and 4b. After being pressure-bonded to the inner leads 4a and 4b, the bonding wires 5 are pulled or drawn up and are then cut by the clamp 10. Thus, one process for the bonding work is completed. In the manner stated above, respective bonding pads are connected to corresponding inner leads two by two using bonding wires. Thus, when the connection of all the bonding pads is completed, the total process of the wire bonding applied to this semiconductor device is completed.

As stated above, in accordance with bonding using this apparatus, two bonding wires 5a and 5b are delivered to the adjacent two bonding pads at the same time, and the two bonding wires are pressure-bonded by the pressure-bonding portion 8. Accordingly, there may be employed an arrangement such that two bonding wires 5a and 5b are delivered from the two spools 9a and 9b at the same time. With the conventional apparatus, the value to be weighted at the time of pressure-bonding (the pressure-bonding weight) is 30 to 50 grams. In this respect, with this apparatus, the setting is preferably made such that the pressure-bonding weight is two times larger than the conventional value because two bonding wires are employed. In addition, conditions such as, e.g., ultrasonic oscillation timing at the time of pressure-bonding, pressure-bonding operation of the capillary and bonding temperature etc., are the same as those in the conventional apparatus. When the connection on the side of the bonding pads is completed, the connection on the side of the inner leads will be conducted in the same manner. While the single clamp 10 has a mechanism capable of cutting two bonding wires at the same time for cutting wires after the connection, separate clamps may be provided with respect to the bonding wires 5a and 5b.

To clarify the features of the structure of the capillary 6 employed in the present invention, the structure of a conventional capillary will be referred to with reference to FIG. 3 wherein FIG. 3(a) is an enlarged cross sectional view showing the end portion of the conventional capillary designated by reference numeral 6' and FIG. 3(b) is a view when the desired portion is viewed from Z direction. The capillary 6' is provided at the end portion thereof with only one through hole 7. The bonding wire 5 is delivered into the through hole 7 from a spool (not shown). As described above, the problems with such a conventional apparatus are as follows.

(1) Bonding speed is slow.

(2) There is a limitation in the high density implementation.

(3) Life time of capillary is short.

Such problems can be eliminated by the employment of the apparatus according to the present invention as understood from the following description.

(I) The problem of bonding speed.

In accordance with this apparatus, bonding can be performed on each adjacent sets of pair of bonding pads and pairs of inner leads at the same time, thus allowing the bonding time to be reduced to one-half.

(II) The problem of the high density implementation.

There has been a limitation in the high density implementation in the case of the conventional apparatus for the reasons stated below.

(i) As the pitch is reduced, there occurs a need to reduce the width of the end portion of the capillary 6', i.e., the width W shown in FIG. 3(b). This is because there is the possibility that if the width W is large, the capillary 6' itself contacts the adjacent wire which has been subjected to bonding and thereby cuts this wire. However, the reduction of the width W is very difficult in the machining of the capillary 6'. In addition, there occurs the problem that, the smaller the width W is, the weaker the strength of the end portion of the capillary 6' is.

(ii) As the pitch is reduced, interference between adjacent wires which have been subjected to bonding is likely to occur. Since the bonding wire is stretched and somewhat loosened, contact between adjacent wires is likely to occurs according as the pitch is reduced.

(iii) As the pitch is reduced, the bonding pad also becomes small, with the result that the bonding wire used must be further thinned. In addition, the width W of the end portion of the capillary 6' must also be reduced as described above. However, in order to pressure-bond such a fine wire using the capillary, it is necessary to lessen the pressure-bonding weight. For this reason, there occurs the drawback that the capillary 6' is subjected to jumping at the time of pressure-bonding.

In contrast, since the apparatus according to the present invention can reduce the bonding pitch P without reducing the width W of the end portion 8 of the capillary 6, the end portion 8 can ensure a sufficient strength, resulting in realization of the capillary having a long life time. Further, since there is no need to lessen the pressure-bonding weight at the time of pressure-bonding, the problem of the jumping at the time of pressure-bonding of the capillary is avoided. In addition, since two bonding wires are stretched each time, at least bonding wires hang down between the bonding pad and the inner lead with their being nearly equidistantly maintained. This permits the high density implementation, thereby making it possible to reduce the probability of interference between wires.

(III) The problem of life time of the capillary.

As previously described in the item (2), since the bonding pitch P can be reduced without reducing the width W of the end portion of the capillary 6, the end portion 8 be of a sufficient strength, resulting in realization of the capillary having a long life time.

The application of the bonding apparatus according to this embodiment is limited to the case where the bonding pad pitch and the inner lead pitch are equal. However, since both the pitches must be equal when an attempt is generally made to realize high density implementation of multi-terminal configuration, there occurs no problem in practice.

While in the above-mentioned embodiment the two bonding wires are caused to pass through the capillary, the present invention is not limited to such an implementation. For instance, three through holes or more may be provided to pass three bonding wires or more therethrough. In addition, while the above-mentioned embodiment relates to the apparatus for effecting wedge bonding, the present invention is applicable to an apparatus for effecting a ball bonding in the same manner.

As understood from the foregoing description, the wire bonding apparatus according to the present invention is adapted to pass a plurality of bonding wires through the capillary to apply bonding to the plurality of wires at the same time. Accordingly, this improves bonding speed, realizes high density implementation, and can make the life time of the apparatus long.

What is claimed is:

1. A wire bonding apparatus comprising a capillary having a plurality of through holes for passing bonding wires therethrough, a wire supply unit for simultaneously supplying a plurality of bonding wires, a drive unit adapted to move said capillary to a predetermined bonding position, and a connecting unit for connecting said plurality of bonding wires to a plurality of elements subject to bonding at said predetermined bonding position.

2. A wire bonding apparatus as claimed in claim 1, wherein said through holes have a pitch equal to a pitch of said element subject to bonding.

3. A wire bonding apparatus as claimed in claim 1, wherein said connecting device connects said wires to said elements subject to bonding by means of wedge bonding and said capillary comprises a wedge part for pressing and cutting said plurality of wires simultaneously.

4. A wire bonding apparatus as claimed in claim 2, wherein said connecting device connects said wires to said elements subject to bonding by means of wedge bonding and said capillary comprises a wedge part for pressing and cutting said plurality of wires simultaneously.

* * * * *